(12) United States Patent
Stecher et al.

(10) Patent No.: US 6,262,457 B1
(45) Date of Patent: Jul. 17, 2001

(54) METHOD OF PRODUCING A TRANSISTOR STRUCTURE

(75) Inventors: Matthias Stecher, Villach (AT); Tim Gutheit, München; Werner Schwetlick, Gröbenzell, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/038,638

(22) Filed: Mar. 10, 1998

(30) Foreign Application Priority Data

Mar. 10, 1997 (DE) .............................. 197 09 724

(51) Int. Cl.[7] ............................... H01L 71/8232

(52) U.S. Cl. ...................... 257/372; 257/373; 257/375

(58) Field of Search .................... 257/371, 372, 257/373, 375; 438/416, 418, 419

(56) References Cited

U.S. PATENT DOCUMENTS

| 3,443,176 | * | 5/1969 | Agusta et al. . |
| 3,595,713 | * | 7/1971 | Brebisson et al. . |
| 3,885,998 | * | 5/1975 | Reindl . |
| 4,975,764 | * | 12/1990 | Hsu . |
| 5,031,019 | * | 7/1991 | Kosaka et al. . |
| 5,156,989 | * | 10/1992 | Williams et al. . |
| 5,786,617 | * | 7/1998 | Merrill et al. . |
| 5,990,535 | * | 11/1999 | Palara . |

FOREIGN PATENT DOCUMENTS

0405045B1   12/1995   (EP) .

OTHER PUBLICATIONS

"Mikroelektroniktechnologie", Schade, Verlag Technik, Berlin, 1991, pp. 110–111.
"Technologie hochintegrierter Schaltungen", D. Wildmann et al., Springer Verlag, 2$^{nd}$ Edition, 1996, pp. 320–321, No. 3 and 4.

* cited by examiner

*Primary Examiner*—George Fourson
(74) *Attorney, Agent, or Firm*—Herbert L. Lerner; Laurence A. Greenberg; Werner H. Stemer

(57) ABSTRACT

Additional degrees of freedom are provided for optimizing the component properties by combining two doping profiles. The threshold voltage of NMOS or DMOS transistors can be set through the process parameters involved in the introduction and outward diffusion of the further dopant of the second conductivity type, independently of the deep concentration, since the dopant concentration at the surface can be chosen independently of the dopant concentration at depth. A low film resistance results from the great penetration depth of the semiconductor region through the combination of the two dopant profiles. The low film resistance leads to reduced pinching of the substrate current in an NMOS transistor, and to greater stability against "latch-up", without substantially increasing the concentration of the dopants in the region of source/drain diffusions, and therefore without unfavorably affecting drain/bulk capacitance. In addition, the concentration of the further dopant of the second conductivity type can be kept low. A semiconductor region of a second conductivity type is thus attained which exhibits little outward lateral diffusion. Further, when the components are given the conventional polarity, the semiconductor region is insulated from the p-substrate by the buried zone.

5 Claims, 3 Drawing Sheets

METHOD OF PRODUCING A TRANSISTOR STRUCTURE

BACKGROUND OF THE INVENTION

Field of the Invention

The present invention relates to a method for producing a transistor structure, in particular a MOS transistor structure, and to a transistor structure.

In many applications of modern electronics, the problem arises that, besides the pure processing of information, the electronic product must also interact with its environment in some way. One example of this involves the control system for an airbag, which on the one hand evaluates the signals measured by an acceleration sensor and on the other hand triggers the airbag in the event of an accident.

For economic reasons, it would be advantageous if all these different functions could be integrated in a single semiconductor product. However, the production of such "smart-power" products places great demands on the production process which is used. Thus, for example, a variety of component types, such as CMOS transistors, DMOS power transistors and bipolar transistors, need to be integrated with high packing density on a chip. However, the production process should at the same time involve a minimum number of dopant implantation and dopant diffusion steps, and few masking planes.

The number of dopant implantation and dopant diffusion steps is customarily reduced by using one dopant implantation and dopant diffusion step, as well as the resulting dopant profile, for a plurality of different components. In this case, however, it must be taken into account that different components have different requirements in terms of their doping profile. For example NMOS and DMOS transistors require a specific surface concentration of the dopant in the region of the p-channel in order to give a defined transistor threshold voltage. In the case of JFETs and controllable resistors, it is advantageous to provide a weakly doped flat P-area. However, in order to improve the invulnerability of an NMOS transistor to latch-up, it is necessary to form a p-well with a low film resistance. A deep rectangular profile would be ideal for this purpose.

Since these different requirements cannot be covered by one doping profile, but on cost grounds it is only possible to have a few dopant implantation and dopant diffusion steps, it has not to date been possible to set optimum doping profiles for the respective component. In particular, it has not been possible to produce a p-well with a deep rectangular profile, as would be beneficial for NMOS transistors, since this would result in a very high degree of lateral diffusion out of the p-wells, in particular the p-wells of other components.

SUMMARY OF THE INVENTION

It is accordingly an object of the invention to provide a method of producing a transistor structure and a transistor structure, particularly a MOS structure, which overcomes the above-mentioned disadvantages of the heretofore-known devices and methods of this general type and which makes it possible to have doping profiles matched to the transistor structure without additional masking planes or additional implantation steps. The primary object with regard to the product is to provide a transistor structure with matched doping profile.

With the foregoing and other objects in view there is provided, in accordance with the invention, a method of producing a transistor, specifically a MOS transistor, with comprises the following steps:

introducing a dopant of a first conductivity type into a semiconductor substrate;

introducing a dopant of a second conductivity type into the semiconductor substrate;

forming an epitaxial layer on the semiconductor substrate;

introducing a further dopant of the second conductivity type into the epitaxial layer; heat treating the semiconductor substrate and the epitaxial layer and causing the dopant of the second conductivity type in the semiconductor substrate and the dopant of the second conductivity type in the epitaxial layer to diffuse out and to form a coherent semiconductor region, and causing the dopant of the first conductivity type in the semiconductor substrate to diffuse out and to form a buried zone;

forming at least a first insulator layer on the semiconductor region of the second conductivity type and structuring the first insulator layer;

forming at least one conducting layer on the first insulator layer and structuring the conducting layer; and introducing a further dopant of the first conductivity type into the semiconductor region of the second conductivity type, and driving in the further dopant to form zones of the first conductivity type in the semiconductor region of the second conductivity type.

With the above and other objects in view there is also provided, in accordance with the invention, a transistor structure, comprising:

a semiconductor substrate;

an epitaxial layer formed on the substrate;

a buried zone of a first conductivity type disposed at an interface boundary between the semiconductor substrate and the epitaxial layer in the semiconductor substrate and in the epitaxial layer;

a semiconductor region of a second conductivity type disposed in the epitaxial layer in contact with the buried zone;

zones of the first conductivity type formed at the surface of the semiconductor region;

at least a first insulator layer disposed on the surface of the semiconductor region between the zones; and at least one conducting layer formed on the first insulator layer.

The primary advantage of the invention is that it provides for additional degrees of freedom for optimizing the component properties by combining two doping profiles. The threshold voltage of the NMOS or DMOS transistors can be set through the process parameters involved in the introduction and outward diffusion of the further dopant of the second conductivity type, independently of the deep concentration, since the dopant concentration at the surface can be chosen independently of the dopant concentration at depth. The low sheet resistance results from the large penetration depth of the semiconductor region through the combination of the two dopant profiles. The low film resistance leads to reduced pinching of the substrate current in an NMOS transistor, and to greater stability against "latch-up", without substantially increasing the concentration of the dopants in the region of source/drain diffusions, and therefore without unfavorably affecting drain/bulk capacitance. In addition, the concentration of the further dopant of the second conductivity type can be kept low, by means of which a semiconductor region of a second conductivity type is achieved which exhibits little outward lateral diffusion.

Further, when the components are given the conventional polarity, the semiconductor region is insulated from the p-substrate by the buried zone.

In accordance with an added feature of the invention, oxide regions are produced at the edge of the semiconductor region which ensure that the transistor structure is insulated. It is in this case particularly preferable for the oxide regions to be produced by a LOCOS process.

In accordance with an additional feature of the invention, at least one deep diffusion area is produced in contact with the buried zone. It is in this case particularly preferable for the deep diffusion area to be produced by a furnace process and a heat treatment.

In accordance with a concomitant feature of the invention, at least one insulation area is produced. The insulation area is preferably produced by a dopant of the second conductivity type, which has been introduced into the semiconductor substrate, and a dopant of the second conductivity type, which has been introduced into the epitaxial layer, diffusing out and forming the insulation area.

Other features which are considered as characteristic for the invention are set forth in the appended claims.

Although the invention is illustrated and described herein as embodied in a method for producing a transistor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
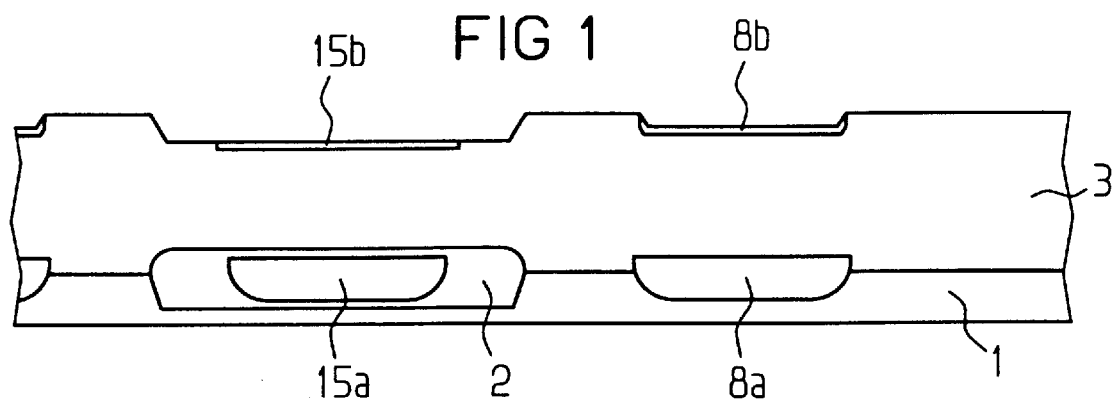
FIGS. 1 to 4 are schematic side views illustrating the production method according to the invention.

Referring now to the figures of the drawing in detail and first, particularly, to FIG. 1 thereof, there is seen a base structure upon which the invention is based. In a p-substrate 1, the electron donor antimony is implanted as a dopant of a first conductivity type in the region of the buried layer which is yet to be produced. The electron acceptor boron is subsequently implanted in the p-substrate 1 as a dopant of a second conductivity type 15a, 8a. In this case, the dopant boron is implanted both in the region of the buried layer which is yet to be produced, and in the region of the lower insulation which is also yet to be produced. After this, an n-conducting silicon layer 3 is applied epitaxially and, using two photographic techniques, the dopant boron is implanted as a further dopant of the second conductivity type 15b, 8b, in the region of the future p-well 15 (semiconductor region 15) and in the region of the future upper insulation. The resulting structure is shown in FIG. 1.

Figure 2:
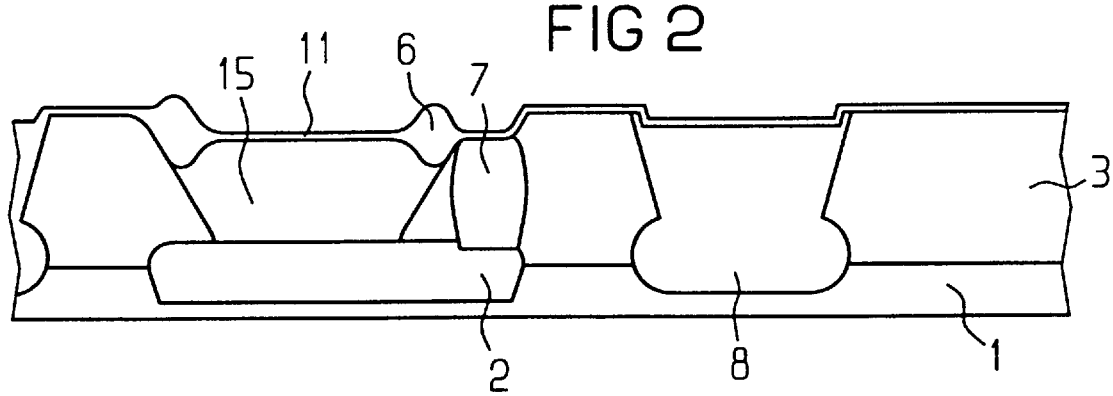

Next, using a LOCOS process, LOCOS oxide regions 6 are produced at the edge of the future p-well 15. A furnace process then takes place in the region of a future deep diffusion area 7, in order to introduce the dopant phosphorus into the n-conducting epitaxial layer 3. As a result of a heat treatment carried out on the semiconductor body, the various dopants which have been introduced into the p-substrate 1 and into the epitaxial layer 3 diffuse out. This results in the p-well 15 (semiconductor region 15), the deep diffusion area 7 and the insulation area 8, which is composed of the two diffusion areas, to be precise of the diffusion area of the dopant 8b which had been implanted into the epitaxial layer 3 and diffuses downward, and of the diffusion area of the dopant 8a which had been implanted into the p-substrate 1 and diffuses upward. The p-well 15 is likewise composed of two diffusion areas. More precisely, it includes the diffusion area of the dopant 15b which had been implanted into the epitaxial layer 3 and diffuses downward, and of the diffusion area of the dopant 15a which had been implanted into the p-substrate 1 and diffuses upward. In this case, use is made of the fact that the dopant boron has a higher mobility than the dopant antimony, and the dopant boron therefore diffuses further in the direction of the surface of the semiconductor body than the dopant antimony. This results in a deep p-well 15 with a limited lateral extent, with which the buried zone (layer) 2 makes contact. In this way, when the components are given the conventional polarity, the p-well 15 is insulated from the p-substrate 1 by the buried zone 2. An oxide layer 11 is subsequently applied to the surface. The resulting structure is shown in FIG. 2.

A doped polysilicon layer 12 is subsequently applied to the surface and the doped polysilicon layer 12 is structured. The oxide layer 11 forms the gate oxide, and the doped polysilicon layer 12 forms the gate electrode of the transistor structure which is yet to be produced. After this, the surface of the poly-layer 12 is oxidized (oxide layer 13).

Figure 3:
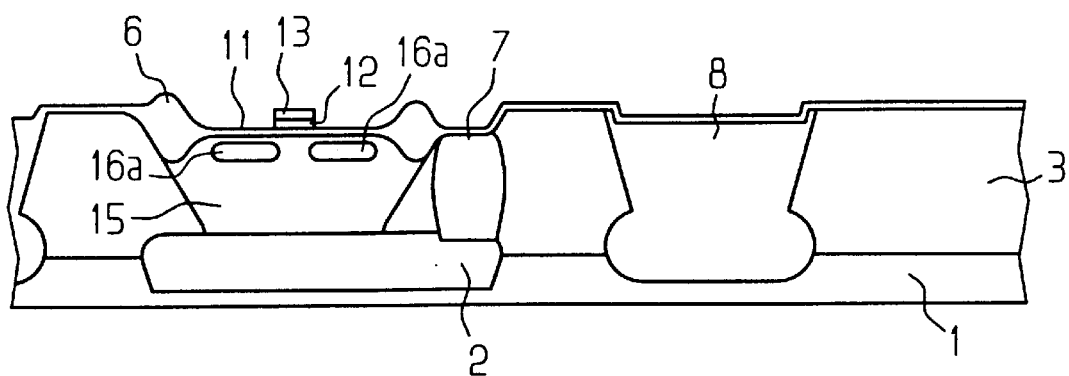

Using a further photographic technique, the dopant arsenic is then implanted and driven under the oxide layer 11 into the p-well 15. With reference to FIG. 3, this results in the n+-doped zones 16a, the source/drain regions of the transistor structure.

Figure 4:
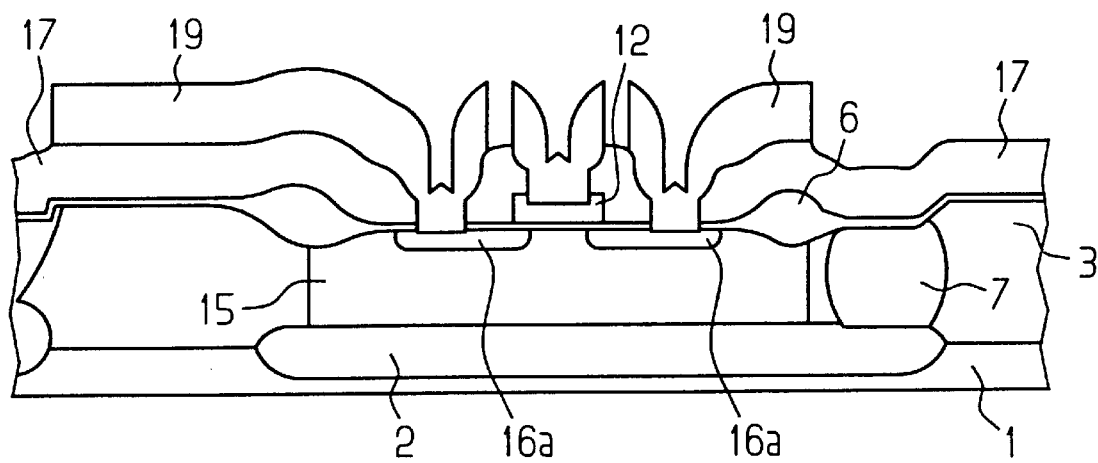

A further insulation layer 17 is subsequently applied to the surface of the semiconductor body. Using a photographic technique, the further insulation layer 17, as well as the oxide layer 11 and the oxide layer 13, are structured using a plasma etching method. This produces contact openings to the n+-doped zones 16 and the doped polysilicon layer 12. A metallization layer 19 is then applied to the surface of the semiconductor body and structured. The resulting structure is shown in the further enlarged view of FIG. 4.

The subsequent steps for producing the semiconductor structures correspond to the conventional prior art. For example, after the metallization layer has been formed and structured, an insulation layer, typically TEOS, is deposited, planarized and structured. A second conductive layer is then applied and structured by forming contacts between the first and second conductive layers. A further insulation layer can then be deposited and structured. A further insulation layer, typically a phosphorus-containing oxide is applied, over which a silicon nitride layer is provided as a passivation layer.

When the NMOS transistor produced in this way is being driven, an electron channel is then formed in the p-well 15 below the oxide layer 11 by applying a voltage to the doped polysilicon layer 12. Electrons can thus flow from the left-hand n+-doped zone 16a (source) to the right-hand n+-doped zone 16a (drain). The large electric field in the drain region may in this case lead to the production of electron/hole pairs. While the electrons formed in this way are discharged via the drain area 16a, the holes formed in this way must flow through the p-well 15 to a non-illustrated p-well connection and therefore lead to a substrate current.

Figure 5:
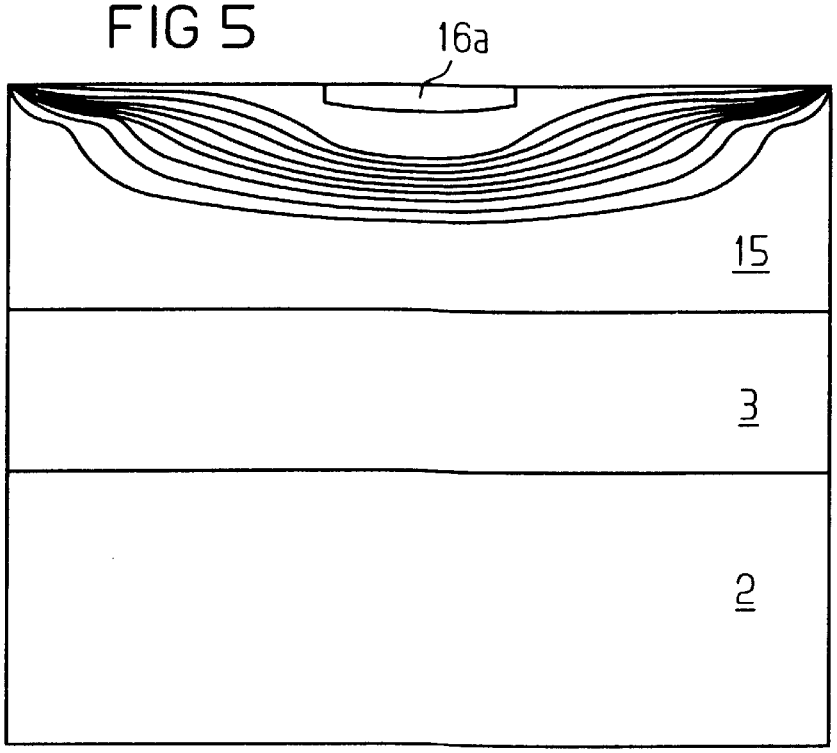
FIG. 5 is a substrate current profile underneath the drain region of a conventional NMOS transistor.

FIG. 5 shows the profile of the substrate current underneath the drain area for a conventional NMOS transistor. There, a p-well connection is provided on the right-hand side of the drain area, and the production of holes is simulated by a current source on the left-hand side of the drain region. FIG. 5 shows that, in the conventional NMOS transistor, the flat doping profile of the p-well 15 leads to the substrate current being pinched below the drain region. This pinching leads to an increased voltage drop in the p-well 15, the effect of which may be to turn on the parasitic NPN transistor formed by the source region, the p-well and the drain region. This can cause the component to malfunction.

Figure 6:
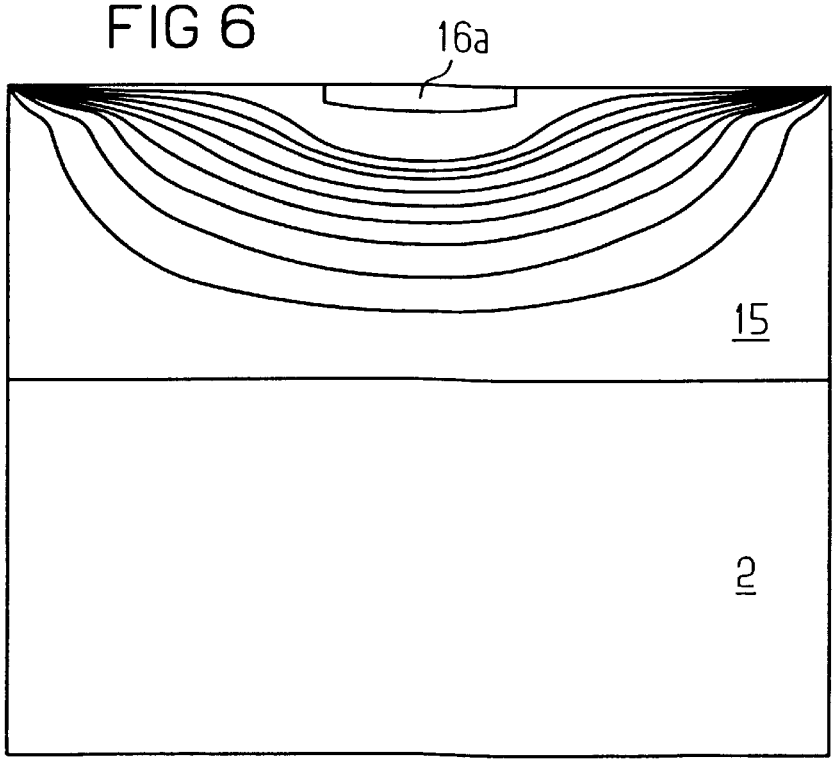
FIG. 6 is a substrate current profile underneath the drain region of an NMOS transistor according to the invention.

FIG. 6 shows the profile of the substrate current underneath the drain region of an NMOS transistor according to the invention. By virtue of the combination of two dopant profiles, the NMOS transistor according to the invention has a deeper total profile, so that pinching of the substrate current under the drain region 16a is avoided. The voltage drop in the p-well 15 is therefore also considerably smaller and the parasitic NPN transistor formed by the source region, the p-well and the drain region can be effectively suppressed.

We claim:

1. A transistor structure, comprising:

a semiconductor substrate of a second conductivity type;

an epitaxial layer of a first conductivity type formed on said substrate and defining an interface boundary with said substrate;

a buried zone of the first conductivity type disposed at the interface boundary between said semiconductor substrate and said epitaxial layer in said semiconductor substrate and in said epitaxial layer;

a semiconductor region of the second conductivity type disposed in said epitaxial layer in contact with said buried zone, said semiconductor region having a surface;

zones of the first conductivity type formed at said surface of said semiconductor region;

at least a first insulator layer disposed on said surface of said semiconductor region between said zones; and at least one conducting layer formed on said first insulator layer;

a diffusion region extending from said first insulation layer to said buried zone;

a further doped region of the second conductivity type extending from said first insulation layer through said epitaxial layer to said semiconductor substrate, said further doped region capable of acting as an isolation region.

2. The transistor structure according to claim 1, including a further insulator layer formed on said conducting layer.

3. The transistor structure according to claim 1, which further comprises oxide regions formed at the surface of said semiconductor region.

4. The transistor structure according to claim 3, wherein said oxide regions are LOCOS oxide regions.

5. A MOS transistor structure, comprising:

a semiconductor substrate of a second conductivity type;

an epitaxial layer of a first conductivity type formed on said substrate and defining an interface boundary with said substrate;

a buried zone of the first conductivity type disposed at the interface boundary between said semiconductor substrate and said epitaxial layer in said semiconductor substrate and in said epitaxial layer;

a semiconductor region of the second conductivity type disposed in said epitaxial layer in contact with said buried zone, said semiconductor region having a surface;

zones of the first conductivity type formed at said surface of said semiconductor region;

at least a first insulator layer disposed on said surface of said semiconductor region between said zones; and at least one conducting layer formed on said first insulator layers;

a diffusion region extending from said first insulation layer to said buried zone;

further doped region of the second conductivity type extending from said first insulation layer through said epitaxial layer to said semiconductor substrate, said further doped region defining an insulation region.

* * * * *